United States Patent [19]

Erdmann

[11] Patent Number: 5,044,306
[45] Date of Patent: Sep. 3, 1991

[54] SOLDER APPLYING MECHANISM

[76] Inventor: Gunter Erdmann, 18 Ponderosa La., Walpole, Mass. 02032

[21] Appl. No.: 535,847

[22] Filed: Jun. 11, 1990

[51] Int. Cl.⁵ .............................................. B05C 1/02
[52] U.S. Cl. .................................... 118/120; 101/123; 101/126; 118/301; 118/306; 427/96
[58] Field of Search .................. 118/213, 109, 56, 74, 118/120, 207, 21, 30, 301, 406, 407; 427/96, 120

[56] References Cited

U.S. PATENT DOCUMENTS

| | | | |
|---|---|---|---|
| 2,704,510 | 3/1955 | Walsh | 101/123 |
| 2,881,698 | 4/1959 | Graham | 101/123 |
| 3,731,623 | 5/1973 | Bubley et al. | 101/114 |
| 4,075,968 | 2/1978 | Caddock | 118/708 |
| 4,121,519 | 10/1978 | Porth | 101/124 |
| 4,246,866 | 1/1981 | Hopings et al. | 118/213 |
| 4,586,433 | 5/1986 | Jaffa et al. | 101/123 |
| 4,589,336 | 5/1986 | Klemm | 101/124 |
| 4,622,239 | 11/1986 | Schoenthaler et al. | 118/406 |
| 4,678,531 | 7/1987 | Metzger et al. | 156/250 |
| 4,693,209 | 9/1987 | Leicht | 118/213 |
| 4,747,211 | 5/1988 | Gilleo et al. | 29/852 |
| 4,776,271 | 10/1988 | Schlipf et al. | 118/213 |
| 4,919,970 | 4/1990 | Hoebener et al. | 118/213 |

Primary Examiner—Willard Hoag
Attorney, Agent, or Firm—Hamilton, Brook, Smith & Reynolds

[57] ABSTRACT

Mechanism is disclosed for wiping solder paste onto a printed circuit board through a stencil superposed on the board, including a first squeeges for wiping solder paste onto the stencil, a second squeegee for depositing solder paste at a location for engagement by the first squeeges and a tray, alternatively engagable with both squeeges to cooperate with the squeeges to deposit solder paste at the beginning of a wiping stroke and to pick up excess solder paste at the end of a wiping stroke.

12 Claims, 5 Drawing Sheets

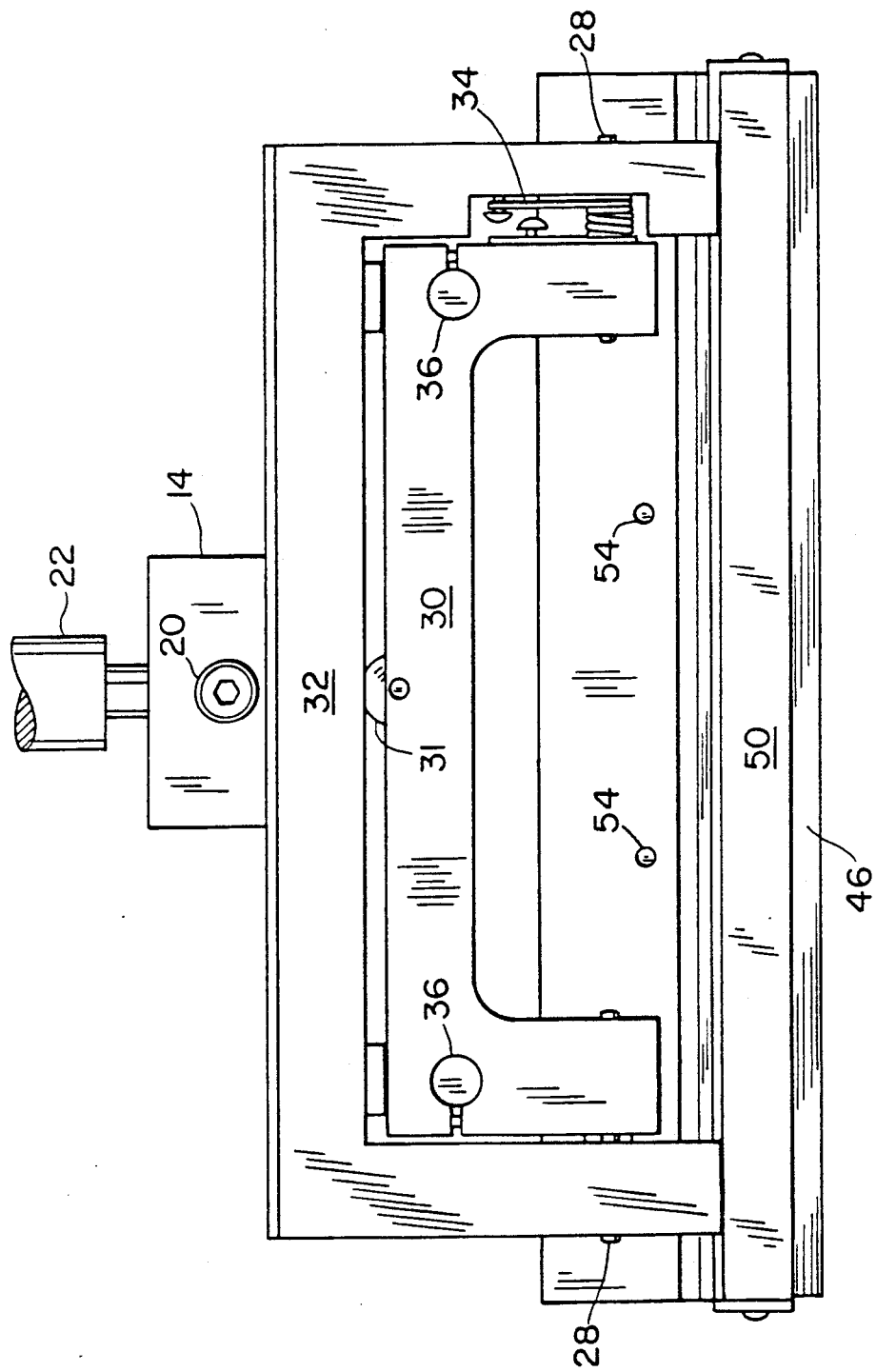

SOLDER APPLYING MECHANISM

FIELD OF THE INVENTION

This invention relates generally to surface mount technology and, more particularly, to mechanism for wiping solder paste onto a printed circuit board through a stencil superposed on the board.

BACKGROUND OF THE INVENTION

A common technique for manufacturing printed circuit boards is to mount components directly on the surface of the printed boards by soldering. This has all but replaced the technique of securing components to a board by inserting wire leads from the components through drilled holes in the board, bending the leads over, then soldering them to conductive paths on the backside of the board.

In the surface mount technology, the surface of the board contains a multiplicity of pads, usually copper, to which components are directly soldered. The pads are connected by appropriate conductor paths in or on the board. Solder, in the form of thick, viscus paste is made of finely ground solder particles carried in a flux. The solder paste is applied only to the pads prior to the components being applied, which is then followed by the actual soldering. The solder is applied to the pads through a stencil which is superposed on the board with holes in the stencil corresponding in size and registered with the pads.

The boards are received, one by one, beneath the fixed horizontal stencil in a table adjustable on X and Y axes. The solder paste is wiped across the stencil and, thus, through the holes onto the pads.

There are problems common to conventional screen printers which are used in the stencil printing process. One problem relates to solder paste displacement. Solder is deposited on one edge of the stencil at the beginning of a wiping stroke and is wiped across the stencil. If the paste is displaced laterally of the stencil and it is not used for the next print, it will dry up and become worthless. This requires extra cleaning. Overcoming the problem requires constant operator attention, requiring him to continuously move the paste back to the leading edge of the print area. This is not only time consuming, but it is hazardous.

There are offset errors commonly encountered when using conventional printers. They are particularly noticeable when dealing with tightly toleranced printed circuit boards, such as those incorporating twenty to twenty-five mil pitch devices. Many screen printers employed in the stencil printing process have squeegees which spread the solder across the surface of the stencil. At the end of a wiping stroke, the squeegee is automatically lifted off the stencil and moved over the deposited ridge of solder paste and then lowered behind the ridge to repeat a wiping stroke in the opposite direction. This technique has been referred to as "hop over". While theoretically advantageous in actual production, sometimes as much as 70% of the paste will stick to the squeegee and, thus, end up on the opposite side of the squeegee for the return wiping stroke.

Another problem encountered in the process is for the squeegee blade to gradually displace the solder paste laterally of its direction of movement causing it to pile up outside the actual print area. While the "hop over" technique has been employed with some success, eventually there is not enough paste in front from the squeegee blade to produce a satisfactory deposition. At that time, the operator will have to physically move the paste by hand back into the print area. If he neglects to do so, the paste which is outside the print area and no longer being wiped by the squeegee, produces a poor deposition of paste onto the board and dries up and becomes useless.

One attempt to solve this problem was to employ printers with two squeegees that operate independently. The solder paste is located on the stencil between the squeegee and is wiped first in one direction and then in the opposite direction. This solution has created a new problem because printing with two squeegees can result in two different types of print. For example, sometimes the edges are not equally straight.

Another problem is stencil offset. The stencil itself is usually held in a frame by a border of tensioned polyester. During the wiping action of one squeegee, the stencil can be offset in the direction of wipe due to stretching of the polyester, thus, offsetting the stencil holes relative to the pads with which they are intended to register. This is referred to as "screen stretch". It is caused by the friction between the squeegee and the stencil applying stretching action to the polyester border.

Depending upon the width of the polyester border around the actual stencil foil, the length of the squeegee, and the amount of squeegee pressure against the stencil, the stencil offset from the pads could be from 0.002 to 0.005 inches in either direction, thus, totaling a four to ten mil total offset. Since this is a repetitious forward and backward offset, the stencil is stretched in two directions and not correctable.

In many instances, offset is not a problem because the solder paste is attracted back to the pads during the reflow or heating process as long as a 50 mil pitch or larger components are being used. However, many printed circuit boards require much higher tolerances, such as those incorporating 20 to 25 mil pitches. In these instances, the shifting of the image during printing is unacceptable. Therefore, it is necessary to eliminate all possible offset errors, which is a primary objective of the present invention.

SUMMARY OF THE INVENTION

The invention resides in mechanism for wiping solder paste onto a printed circuit board through a stencil which is superposed on the board. It includes a first squeegee for wiping solder paste onto the stencil. A second squeegee is provided which cooperates with a tray to deposit solder paste at the beginning of a wiping stroke. The tray also cooperates with the first squeegee to pick up excess solder paste at the end of a wiping stroke. Both squeegees and the movable tray are carried by a carriage which reciprocates relative to the surface of the stencil through the wiping stroke.

The first or wiping squeegee serves the dual function of wiping the paste on the stencil and, secondly, wiping it onto the tray at the end of the wiping stroke. The distributing squeegee serves the function of wiping the solder paste from the tray onto the stencil at a distributing location at the beginning of a wiping stroke. At the end of a wiping stroke, the carriage, the squeegees and the tray are all raised from the stencil and moved back to the distributing position ready to wipe solder paste through the stencil onto the next board.

The tray does not only pivot relative to the two squeegees which are fixed to the carriage, but is movable longitudinally relative to the squeegees. When it is moved toward the squeegees, it moved under the second or distributing squeegee into engagement with the first squeegee to collect the solder paste and then it is moved away from the first squeegee allowing the second squeegee to push the solder paste from the tray onto the starting or distributing end of the stencil.

The tray may be provided with sides to prevent lateral displacement of the solder paste which is collected at the end of each wiping stroke.

The above and other features of the invention, including various novel details of construction and combinations of parts will now be more particularly described with reference to the accompanying drawings and pointed out in the claims. It will be understood that the particular solder applying mechanism embodying the invention is shown by way of illustration only and not as a limitation of the invention. The principals and features of this invention may be employed in varied and numerous embodiments without departing from the scope of the invention.

BRIEF DESCRIPTION OF THE DRAWINGS

FIG. 4 is a rear view thereof.

DETAILED DESCRIPTION OF THE INVENTION

Figure 1:
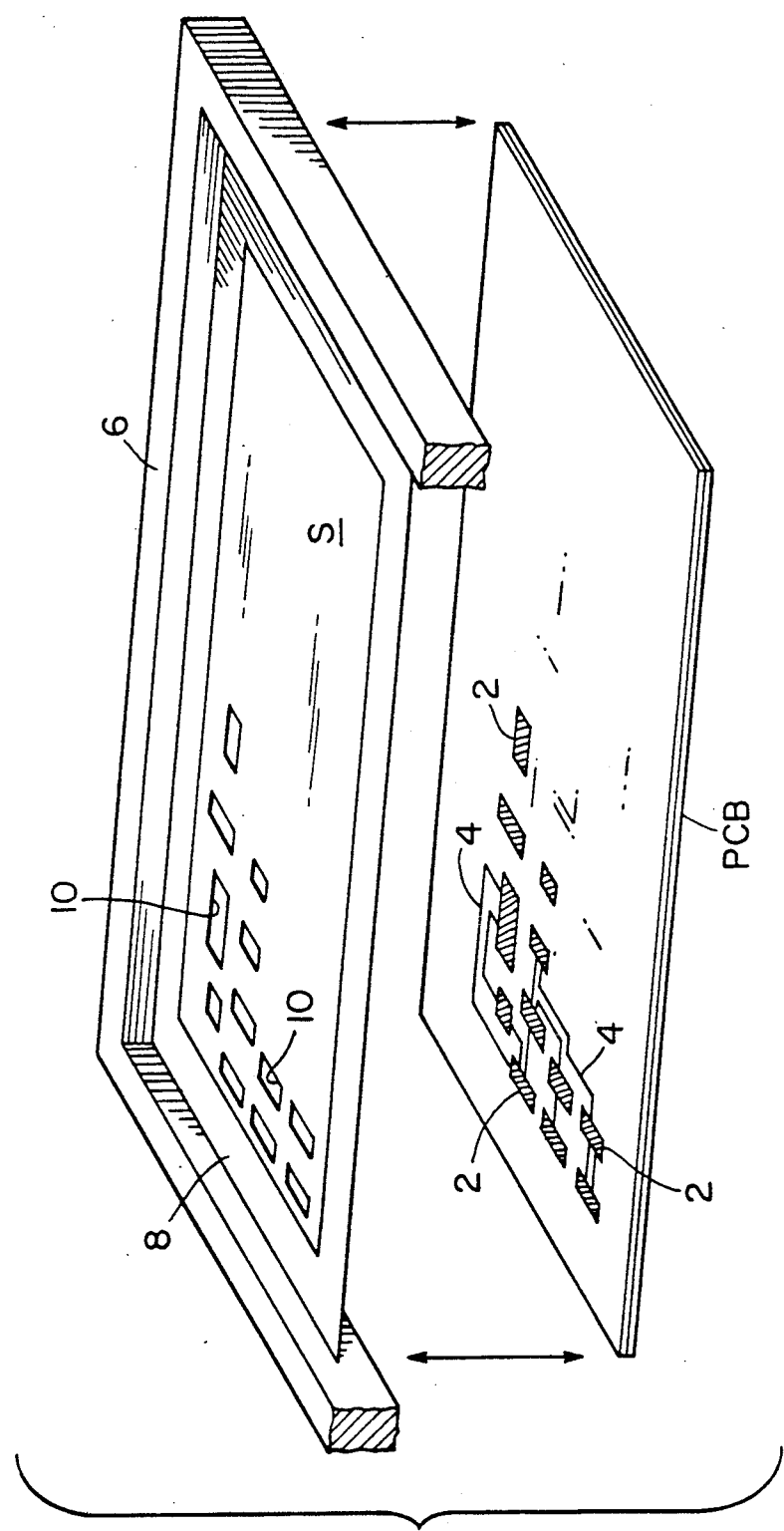
FIG. 1 is an exploded perspective view of a printed circuit board and a stencil employed in the application of paste solder to the pads on the board.

FIG. 1 shows a typical printed circuit board designated PCB having on its surface exposed pads 2, generally of copper, to which components are subsequently to be soldered. The pads are joined by appropriate conductive paths 4. A stencil S is carried in a rigid frame 6 and is joined to the inside of the frame by a polyester border 8. Openings 10 in the stencil correspond in size and location to the pads 2 on the printed circuit board such that when the stencil is superposed on the board, the holes 10 register with the pads 2 leaving them exposed for the application of solder paste. The solder paste is in the form of fine granules of solder carried in a viscous flux and is spread across the exposed surface of the stencil from left to right, as viewed in FIG. 1 from a solder distributing location at the left edge of the stencil to a solder collecting location at the right edge.

Figure 2:
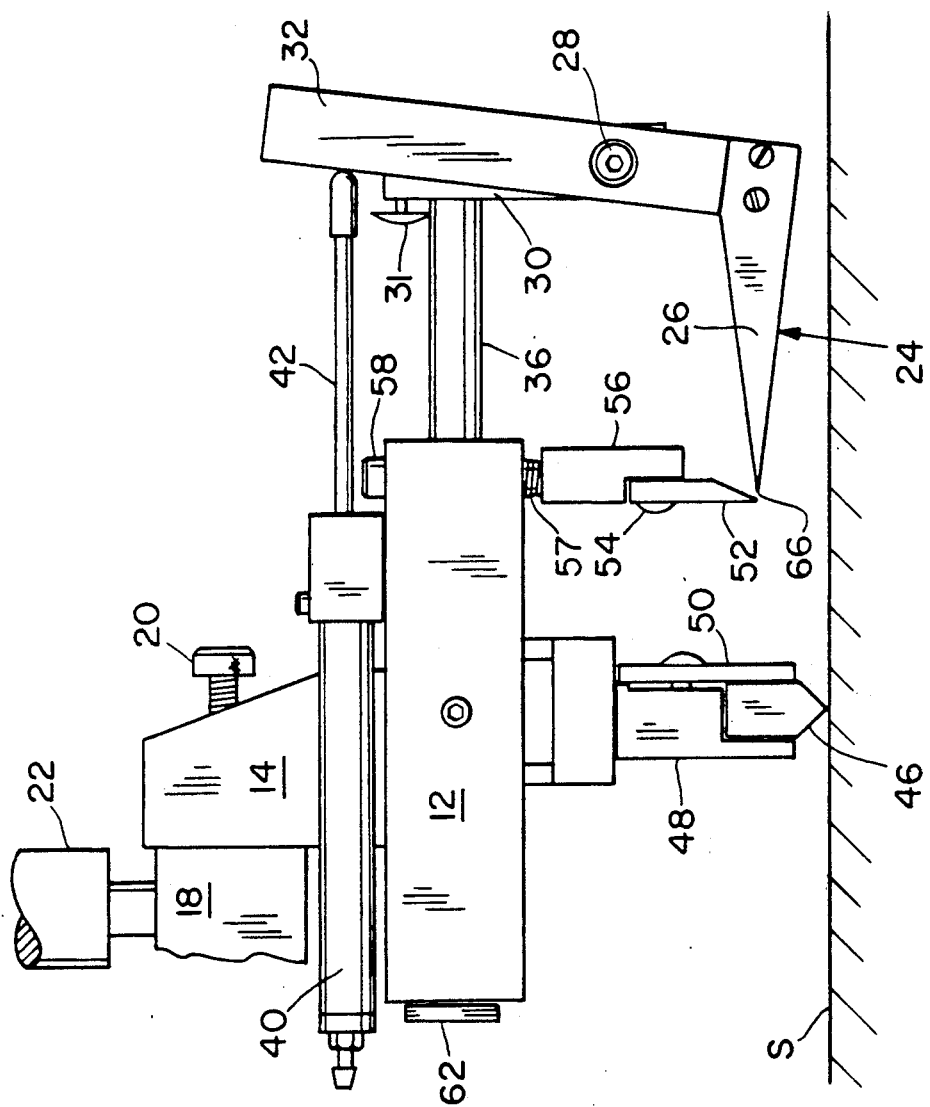
FIG. 2 is a side elevation of mechanism embodying the invention for wiping solder paste onto the printed circuit boards.

The mechanism for wiping solder paste is best seen in side elevation in FIG. 2. The stencil S is locked in place in a horizontal position. Printed circuit boards are fed into registration relative to the stencil by a carrier which is adjustable in the X and Y axes. It is not shown in FIG. 2, but would be located beneath the stencil S.

Figure 3:
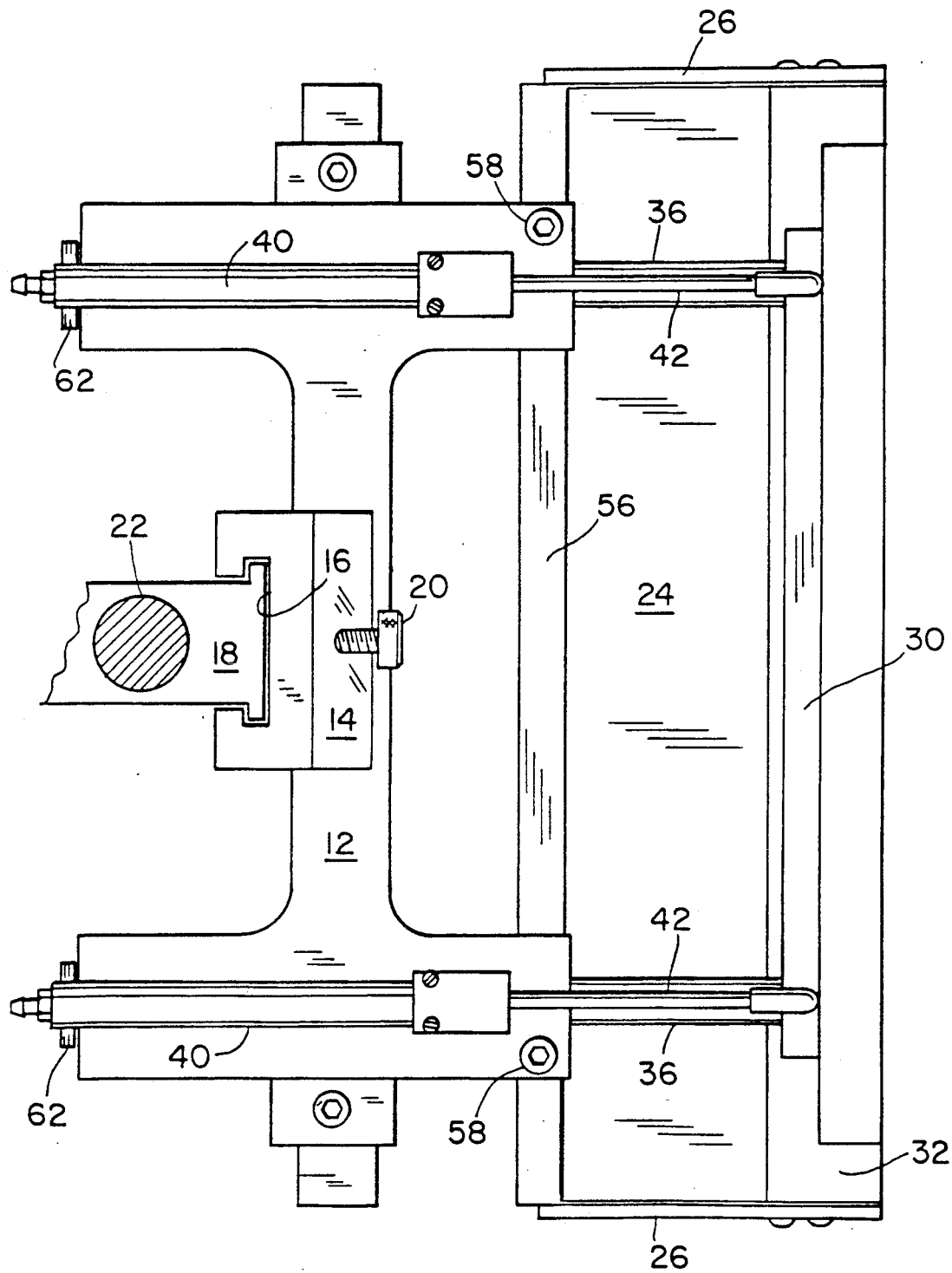
FIG. 3 is a plan view thereof.

The mechanism includes a reciprocating carriage 12 which, when viewed from the top, as in FIG. 3, is generally H-shaped in configuration. The carriage moves relative to the surface of the stencil through a wiping stroke from a solder distributing location at the left-hand side of FIG. 2 to a solder distributing location at the right-hand side. A boss 14 projects upwardly from the carriage 12 and has a T-shaped slot 16 which adjustably receives an arm 18, which is adjustable height-wise relative to the boss 14. It is secured in place by a set screw 20. Attached to the arm 18 is a piston 22 which reciprocates in a cylinder (not shown). While an air cylinder is employed to raise and lower the carriage 12 relative to the surface of the stencil, equivalent mechanisms are within the scope of the invention. The arm 18 and the operating piston 22 are, in turn, attached to the main frame mechanism which causes the carrier 12 and the structure associated with it to reciprocate relative to the stencil in successive wiping strokes.

A tray, generally designated 24 and having side pieces 26, is pivotably mounted on pins 28 on an inverted U-shaped frame member 30 by a slightly larger inverted U-shaped frame member 32 surrounding the frame member 30. The tray 24 is secured to the lower end of the frame member 32, as seen in FIG. 2. A coiled spring 34 or other equivalent means urges the tray 24 in a clockwise direction relative to the frame member 30 against an adjustable stop 31 in the frame member 30.

The frame member 30 and, hence, the tray 24, is extendable toward and away from the carriage 12 by rods 36 which are fixed to the frame member 30 and slide in horizontal bores in the carriage 12. The tray is free to move toward and away from the carriage 12 as the rods slide in and out of the carriage. However, a pair of air cylinders 40, or other equivalent means, are mounted on the carriage. Pistons 42 extend from the cylinders. When activated, the pistons 42 extend to the right, as viewed in FIG. 2, engage the frame member 32 and move it, the frame 30 and the tray 24 to the right or into the position shown in FIG. 2.

A first or wiping squeegee 46, made of polyurethane, is replaceably secured in a bracket 48 by a plate 50. The bracket 48 depends from and is movable with the carriage 12. The squeegee's function is to wipe solder paste across the surface of the stencil and then to move excess solder paste onto the tray 24 at the end of a wiping stroke, as will hereinafter be described.

A second or distributing squeegee 52, made preferably of teflon, is replaceably secured by screws 54 to a squeegee holder 56, which is free floating against the force of springs 57 beneath the carriage 12. Once adjusted to the desired position, the squeegee remains fixed to the carriage for reciprocation back and forth above the surface of the stencil S.

Figure 7:
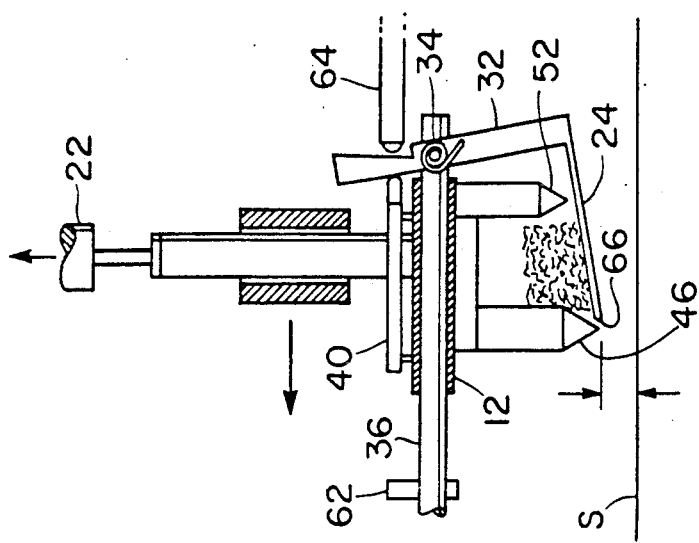
FIGS. 5, 6 and 7 are sequential, schematic views showing the mechanism during the wiping stroke, collecting solder at the end of the wiping stroke and returning solder to the distributing location in preparation for a subsequent wiping stroke, respectively.
Figure 6:
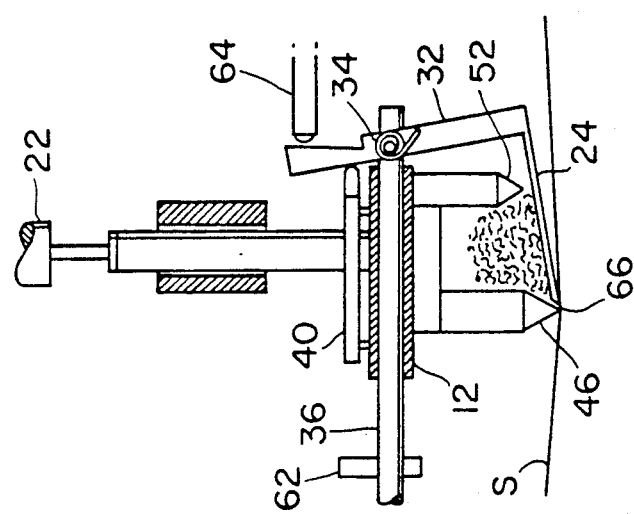
Figure 5:
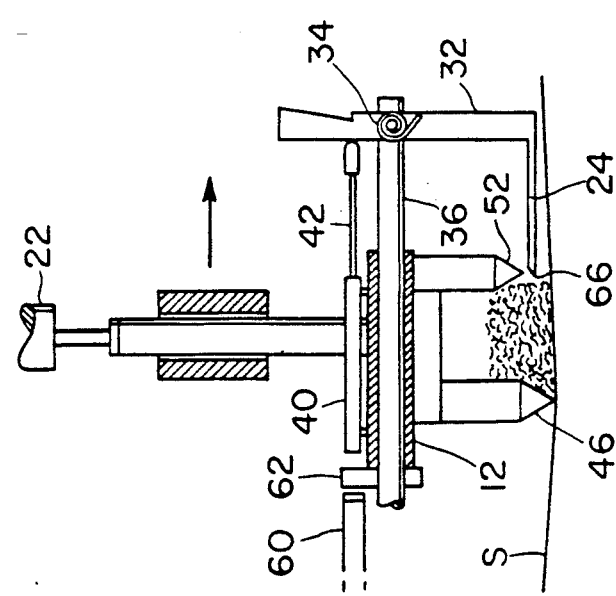

The operation of the mechanism will now be described with reference to FIGS. 5 through 7.

With a printed circuit board in place beneath the stencil, the operator deposits a quantity of solder paste on the edge of the stencil between the wiping squeegee 46 and the distributing squeegee 52 when the machine is at the left-hand end of the stencil. At this time, the pistons 42 of the cylinders 40 are extended to maintain the tray 24 away from the squeegees to leave the space between them empty.

At this point, the mechanism is ready to make the first wiping stroke. The main frame mechanism is actuated to cause the carriage 12, the squeegees 46 and 52, and the tray 24, to move to the right with the wiping squeegee 46 wiping the solder paste across the surface of the stencil S.

At the end of the stroke, which in a typical illustrative machine is about 10 inches, the pivotal frame member 32, which mounts the tray 24, engages a stop 64 on the main frame, which causes the frame 32 to pivot in a counter-clockwise direction against the force of the spring 34 until the edge 66 of the tray 24 engages the surface of the stencil. The tray 24 pivots about 15°, as shown by comparing FIG. 5 to FIG. 6. When frame 32, which then is against the stop 31 in the non-pivotal frame member 30, comes to rest against the stop 64, the rods 36 stop while the carriage 12 continues to move from the FIG. 5 to the FIG. 6 position. At this time, the wiper squeegee 46 is "sweeping" the unwiped solder paste up onto the tray 24 between its sides 26; thus, all unused solder is wiped onto the tray. At this time, one wiping stroke has been completed.

The printed circuit board with solder paste applied to its pads 2 is then automatically removed from its holder and a second board replaces it.

After the paste has been moved onto the tray 24, the entire carriage 12 and its associated mechanism is raised by the pistons 22 from the surface of the stencils which, in a typical application, is approximately a quarter of an inch. Thereupon, the motion of the carriage 12 relative to the main frame is reversed and the solder paste is carried to the left from the collecting location at the end of the wiping stroke back to the distributing location at the beginning of the next wiping stroke, as seen in FIG. 7.

As an alternative to the function of piston 40, stops 60 on the main frame may be employed. They are engagable with heads 62 on the rods 36, causing the rods to move to the right relative to the carriage 12 until the carriage itself comes to rest against the head 62, thus moving the tray away from the squeegees.

When the heads 62 on the rods 36 engage their stops 60, the tray 24, which is moved by the rods 36, comes to rest and, in effect, changes positions relative to the carriage 12 and the squeegees. At this time, the wiping squeegee 52 which is still moving to the left, wipes the solder off of the tray 24 and onto the stencil at the collecting location. Once the tray 24 has become disengaged with the wiping squeegee 52, the spring 34 which maintained the tray in engagement with the bottom of the distributing squeegee 52, pivots the tray 24 to its inoperative position, as seen in FIG. 5.

Since the wiping stroke has taken place in one direction only, i.e., from left to right as herein illustrated, any stretch in the polyester border 8 is unidirectional and can be corrected by adjusting the XY carrier of the printed circuit boards. Once such adjustment has been made, it usually need not be repeated.

I claim:

1. Mechanism for wiping solder paste onto a printed circuit board through a stencil superposed on the board, comprising:
   a) a first squeegee for wiping solder paste onto a stencil
   b) a second squeegee for depositing solder paste at a location for engagement by the first squeegee; and
   c) a movable tray alternatively engagable with both squeegees to cooperate with the second squeegee to deposit solder paste at the beginning of a wiping stroke and to cooperate with the first squeegee to pick up excess solder paste at the end of a wiping stroke.

2. Mechanism according to claim 1 wherein both squeegees and the tray are carried by a reciprocating carriage.

3. Mechanism according to claim 1 wherein the tray is pivotable relative to the squeegees and movable linearly relative to the squeegees.

4. Mechanism according to claim 1 wherein there are means for raising the squeegees and the tray away from the stencil after it has been wiped.

5. Mechanism for wiping solder paste onto a printed circuit board through a stencil superposed on the board, comprising:
   a) a reciprocating carriage movable relative to the surface of a stencil through a wiping stroke from a solder distributing location to a solder collecting location;
   b) a tray pivotably mounted relative to the carriage to receive unwiped solder paste at the collecting location at the end of a wiping stroke and to return the paste to the distributing location at the beginning of a wiping stroke;
   c) a wiping squeegee movable with the carriage to wipe solder paste onto the stencil and to move excess solder paste onto the tray at the end of a wiping stroke;
   d) a distributing squeegee spaced from the wiping squeegee for removing solder paste from the tray and depositing it at the distribution location; and
   e) means for moving the tray from an inactive position to the collecting position wherein it cooperates with the wiping squeegee to collect unspread solder paste at the end of a wiping stroke, to the distributing location wherein it cooperates with the distributing squeegee to deposit solder paste at the distributing location to begin a wiping stroke.

6. Mechanism according to claim 5 wherein there are means for raising the carriage at the end of a wiping stroke after a stencil has been wiped.

7. Mechanism according to claim 5 wherein the means for moving the tray from the inactive position to the collecting position are pneumatic.

8. Mechanism according to claim 5 wherein the tray is provided with sides to prevent lateral displacement of the solder paste.

9. Mechanism for wiping solder paste onto a printed circuit board through a stencil superposed on the board, comprising:
   a) a reciprocating carriage movable relative to the surface of a stencil through a wiping stroke from a solder distributing location to a solder collecting location;
   b) a tray pivotably mounted relative to the carriage to receive unwiped solder paste at the collecting location at the end of a wiping stroke and to return the paste to the distributing location at the beginning of a wiping stroke;
   c) a wiping squeegee movable with the carriage to wipe solder paste onto the stencil and to move excess solder paste onto the tray at the end of a wiping stroke;
   d) a distributing squeegee located between the wiping squeegee and the tray for removing solder paste from the tray and depositing it at the distribution location;
   e) the wiping squeegee being longer than the distributing squeegee; and
   f) means for reciprocating the tray from an inactive position remote from the wiping squeegee to the collecting position adjacent the wiping squeegee wherein it cooperates with the wiping squeegee to collect unspread solder paste at the end of a wiping stroke, to the distributing location wherein it cooperates with the distributing squeegee to deposit solder paste at the distributing location to begin a wiping stroke.

10. Mechanism according to claim 9 wherein there are means for raising the carriage at the end of a wiping stroke after a stencil has been wiped.

11. Mechanism according to claim 9 wherein the means for moving the tray from the inactive position to the collecting position are pneumatic.

12. Mechanism according to claim 9 wherein the tray is provided with sides to prevent lateral displacement of the solder paste.

* * * * *